United States Patent
Iioka et al.

(10) Patent No.: US 7,266,015 B2
(45) Date of Patent: Sep. 4, 2007

(54) REDUNDANCY SUBSTITUTION METHOD, SEMICONDUCTOR MEMORY DEVICE AND INFORMATION PROCESSING APPARATUS

(75) Inventors: Osamu Iioka, Kawasaki (JP); Tetsuji Takeguchi, Kawasaki (JP); Hiroshi Mawatari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 22 days.

(21) Appl. No.: 11/311,485

(22) Filed: Dec. 20, 2005

(65) Prior Publication Data
US 2007/0053229 A1  Mar. 8, 2007

(30) Foreign Application Priority Data
Sep. 7, 2005  (JP) .............................. 2005-259781

(51) Int. Cl.
*G11C 11/34*   (2006.01)
*G11C 16/06*   (2006.01)
(52) U.S. Cl. ............................... 365/185.09; 365/185.2
(58) Field of Classification Search ............ 365/185.09, 365/185.2, 185.22, 185.03
See application file for complete search history.

(56) References Cited

U.S. PATENT DOCUMENTS

| | | | |
|---|---|---|---|
| 6,654,286 B2* | 11/2003 | Kawakami | 365/185.21 |
| 6,967,867 B2* | 11/2005 | Hamaguchi | 365/185.03 |
| 7,126,850 B2* | 10/2006 | Tatsukawa et al. | 365/185.03 |
| 7,180,782 B2* | 2/2007 | Yu et al. | 365/185.21 |

FOREIGN PATENT DOCUMENTS

| | | |
|---|---|---|
| JP | 9-204796 | 8/1997 |
| JP | 2004-319034 | 11/2004 |

* cited by examiner

*Primary Examiner*—Anh Phung
(74) *Attorney, Agent, or Firm*—Arent Fox LLP

(57) ABSTRACT

A redundancy substitution method for memory cells within an electrically writable and erasable semiconductor memory device, includes detecting a memory cell having a tendency of a charge loss and/or a charge gain, by use of a charge loss detecting reference cell and/or a charge gain detecting reference cell. The charge loss detecting reference cell has a threshold value set between a threshold value of a read reference cell and a threshold value of a write verify reference cell that is higher than that of the read reference cell, and the charge gain detecting reference cell has a threshold value set between the threshold value of the read reference cell and a threshold value of an erase verify reference cell that is lower than that of the read reference cell. The method subjects a memory cell whose tendency of the charge loss and/or the charge gain is detected to a redundancy substitution.

20 Claims, 8 Drawing Sheets

FIG.6

| No. | READ DATA OUTPUT | CHARGE LOSS DETECTION DATA OUTPUT | CHARGE GAIN DETECTION DATA OUTPUT | READ RESULT | CHARGE LOSS DETECTION RESULT | CHARGE GAIN DETECTION RESULT | THRESHOLD VALUE REGION |
|---|---|---|---|---|---|---|---|
| 1 | 0 | 0 | 0 | 0 | NO PROBLEM | NO PROBLEM | A1 |
| 2 | 0 | 1 | 0 | 0 | PROBLEM EXISTS | NO PROBLEM | B1 |
| 3 | 1 | 1 | 0 | ABNORMAL DATA | — | — | C |
| 4 | 1 | 1 | 1 | 1 | NO PROBLEM | NO PROBLEM | A2 |
| 5 | 1 | 1 | 0 | 1 | NO PROBLEM | PROBLEM EXISTS | B2 |
| 6 | 0 | 1 | 0 | ABNORMAL DATA | — | — | C |

REDUNDANCY SUBSTITUTION METHOD, SEMICONDUCTOR MEMORY DEVICE AND INFORMATION PROCESSING APPARATUS

BACKGROUND OF THE INVENTION

1. Field of the Invention

The present invention generally relates to redundancy substitution methods, semiconductor memory devices and information processing apparatuses, and more particularly to a redundancy substitution method which enables redundancy substitution by detecting a charge loss and a charge gain of a memory cell, even in a state after the semiconductor memory device is forwarded and assembled into a system, a semiconductor memory device which employs such a redundancy substitution method, and an information processing apparatus having a semiconductor memory device having such a structure.

2. Description of the Related Art

With respect to a nonvolatile semiconductor memory device such as a flash memory having a structure that stores data by accumulating a charge at a floating gate, an accelerated life test is carried out before the nonvolatile semiconductor memory device is forwarded so to make a screening or a redundancy substitution of memory cells indicating a charge loss or a charge gain. The accelerated life test may be an electric field accelerated life test that applies a high voltage to a word line or a bit line or, a high temperature accelerated life test that applying a high temperature to the nonvolatile semiconductor memory device by baking. In other words, the electric field accelerated life test or the high temperature accelerated life test creates a condition approximating an operation guarantee period of the nonvolatile semiconductor memory device, for example, and the memory cell indicating a charge loss or a charge gain outside a tolerable range is substituted by a redundant memory cell. However, after the nonvolatile semiconductor memory device is forwarded and assembled into a system, it is impossible to remedy the charge loss or charge gain that occurs in the nonvolatile semiconductor memory device that has been assembled into the system.

FIG. 1 is a diagram showing a relationship of threshold values of a written memory cell and an erased memory cell and a read reference cell in a conventional nonvolatile semiconductor memory device. In FIG. 1, the ordinate indicates a drain-source current (Ids) of a transistor forming each memory cell in arbitrary units, and the abscissa indicates a gate-source voltage (Vgs) of the transistor forming each memory cell in arbitrary units. In addition, FIG. 2 is a diagram showing distributions of the written cell and the erased cell in the conventional nonvolatile semiconductor memory device. In FIG. 2, the ordinate indicates a number of memory cells in arbitrary units, and the abscissa indicates a threshold value in arbitrary units. As indicated by arrows in FIG. 1, the characteristics of the memory cells are such that the written cell makes a transition towards the lower threshold value (charge loss) and the erased cell makes a transition towards the higher threshold value (charge gain) as the memory cells deteriorate with time.

A Japanese Laid-Open Patent Application No. 9-204796 proposes a flash memory device that is provided with a repair circuit for substituting defective cells within a main memory cell array. A Japanese Laid-Open Patent Application No. 2004-319034 proposes a data processor that realizes a high-speed reading from an on-chip nonvolatile memory and an improved defect remedying efficiency.

Normally, the write or erase is made with respect to the memory cell to a threshold value that does not result in an erroneous read judgement even when the memory cell deteriorates with time, and no problem occurs in the case of a normal memory cell. In addition, in the case of a memory cell that results in the erroneous read judgement, it is possible to substitute the memory cell by a suitable redundant memory cell prior to forwarding the nonvolatile semiconductor memory device, because the memory cell that results in the erroneous read judgement can be screened by the electric field acceleration test or the high temperature acceleration test. However, there exists a memory cell that cannot be screened by the electric field acceleration test or the high temperature acceleration test, but for some reason exhibits a characteristic abnormality indicated by X1 or X2 in FIG. 2 after the nonvolatile semiconductor memory device is forwarded. In the memory cell which exhibits such a characteristic abnormality, the threshold values change to an erroneous read judgement region by moving outside the main distributions of the written cell and the erased cell, and although this memory cell is defective, this defective memory cell cannot be substituted by a redundant memory cell after the nonvolatile semiconductor memory device is forwarded.

SUMMARY OF THE INVENTION

Accordingly, it is a general object of the present invention to provide a novel and useful redundancy substitution method, semiconductor memory device and information processing apparatus, in which the problems described above are suppressed.

Another and more specific object of the present invention is to provide a redundancy substitution method, a semiconductor memory device and an information processing apparatus, which can detect a tendency (or indication) of a charge loss and/or a charge gain and make a redundancy substitution before an erroneous read judgement occurs, even in a state where the semiconductor memory device is assembled into a system.

Still another object of the present invention is to provide a redundancy substitution method for memory cells within an electrically writable and erasable semiconductor memory device, comprising the steps of detecting a memory cell having a tendency of a charge loss and/or a charge gain, by use of a charge loss detecting reference cell and/or a charge gain detecting reference cell, the charge loss detecting reference cell having a threshold value set between a threshold value of a read reference cell and a threshold value of a write verify reference cell that is higher than that of the read reference cell, the charge gain detecting reference cell having a threshold value set between the threshold value of the read reference cell and a threshold value of an erase verify reference cell that is lower than that of the read reference cell; and subjecting to a redundancy substitution a memory cell whose tendency of the charge loss and/or the charge gain is detected. According to the redundancy substitution method of the present invention, it is possible to detect a tendency (or indication) of the charge loss and/or the charge gain and make the redundancy substitution before an erroneous read judgement occurs, even in a state where the semiconductor memory device is assembled into a system.

A further object of the present invention is to provide an electrically writable and erasable semiconductor memory device comprising a plurality of memory cells; a plurality of redundant memory cells; a read reference cell; a charge loss detecting reference cell having a threshold value set between a threshold value of the read reference cell and a threshold value of a write verify reference cell that is higher than that of the read reference cell; a charge gain detecting reference cell having a threshold value set between the threshold value of the read reference cell and a threshold value of an erase verify reference cell that is lower than that of the read reference cell; a detecting part configured to detect a memory cell having a tendency of a charge loss and/or a charge gain, based on an output of the charge loss detecting reference cell and/or an output of the charge gain detecting reference cell; and a redundancy substitution part configured to substitute a memory cell with respect to which the charge loss and/or the charge gain are/is detected by one of the redundant memory cells. According to the semiconductor memory device of the present invention, it is possible to detect a tendency (or indication) of the charge loss and/or the charge gain and make the redundancy substitution before an erroneous read judgement occurs, even in a state where the semiconductor memory device is assembled into a system.

Another object of the present invention is to provide an information processing apparatus comprising a CPU and an electrically writable and erasable semiconductor memory device, wherein the semiconductor memory device comprises a plurality of memory cells; a plurality of redundant memory cells; a read reference cell; a charge loss detecting reference cell having a threshold value set between a threshold value of the read reference cell and a threshold value of a write verify reference cell that is higher than that of the read reference cell; a charge gain detecting reference cell having a threshold value set between the threshold value of the read reference cell and a threshold value of an erase verify reference cell that is lower than that of the read reference cell; a detecting part configured to detect a memory cell having a tendency of a charge loss and/or a charge gain, based on an output of the charge loss detecting reference cell and/or an output of the charge gain detecting reference cell; and a redundancy substitution part configured to substitute a memory cell with respect to which the charge loss and/or the charge gain are/is detected by one of the redundant memory cells. According to the information processing apparatus of the present invention, it is possible to detect a tendency (or indication) of the charge loss and/or the charge gain and make the redundancy substitution before an erroneous read judgement occurs, even in a state where the semiconductor memory device is assembled into a system.

Other objects and further features of the present invention will be apparent from the following detailed description when read in conjunction with the accompanying drawings.

BRIEF DESCRIPTION OF THE DRAWINGS

FIG. 6 is a diagram showing a relationship of outputs of sense amplifiers for reading, charge loss detection and charge gain detection in the nonvolatile semiconductor memory device;

DESCRIPTION OF THE PREFERRED EMBODIMENTS

A description will be given of embodiments of a redundancy substitution method, semiconductor memory device and information processing apparatus according to the present invention, by referring to FIG. 3 and the subsequent drawings.

In an embodiment of the redundancy substitution method according to the present invention, the present invention is applied to an electrically writable (or programmable) and erasable nonvolatile semiconductor memory device. The nonvolatile semiconductor memory device is characterized by having a charge loss detecting reference cell for charge loss detection and/or a charge gain detecting reference cell for charge gain detection, in addition having a read reference cell for reading, a write verify reference cell for write verify, and an erase verify reference cell for erase verify.

Figure 1:
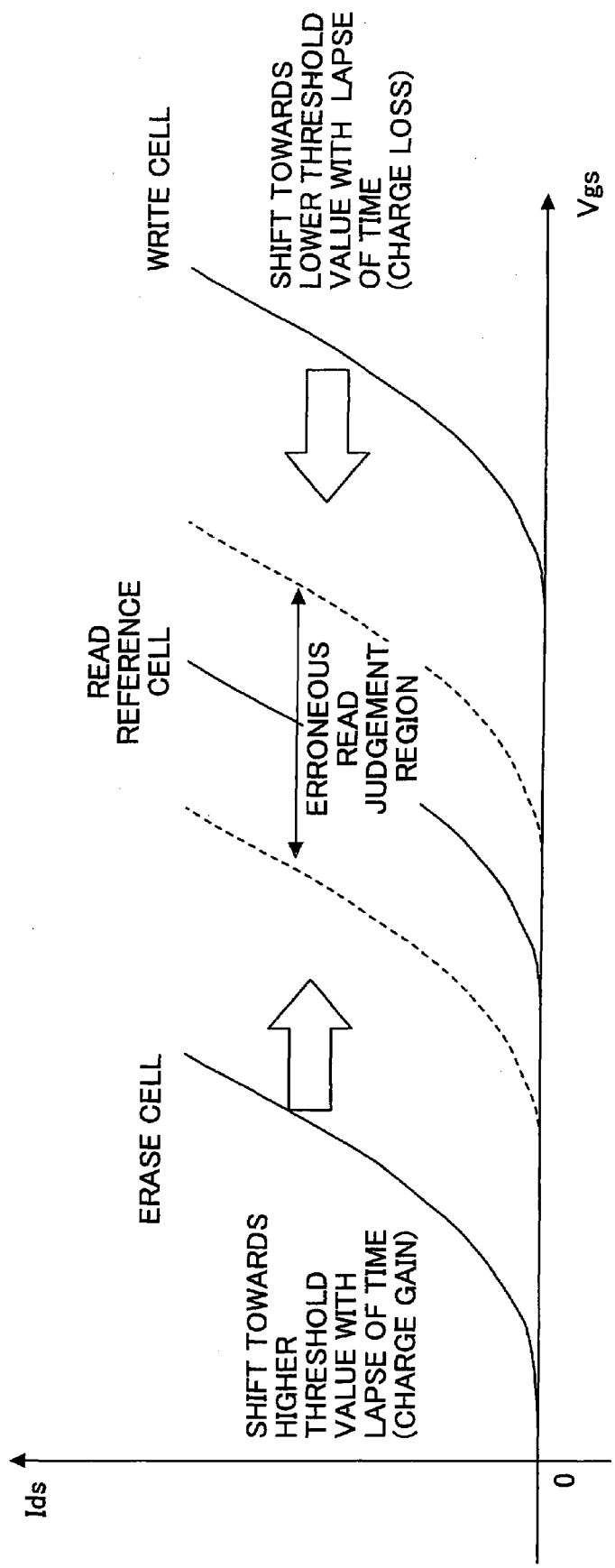
FIG. 1 is a diagram showing a relationship of threshold values of memory cells and a read reference cell in a conventional nonvolatile semiconductor memory device.
Figure 2:
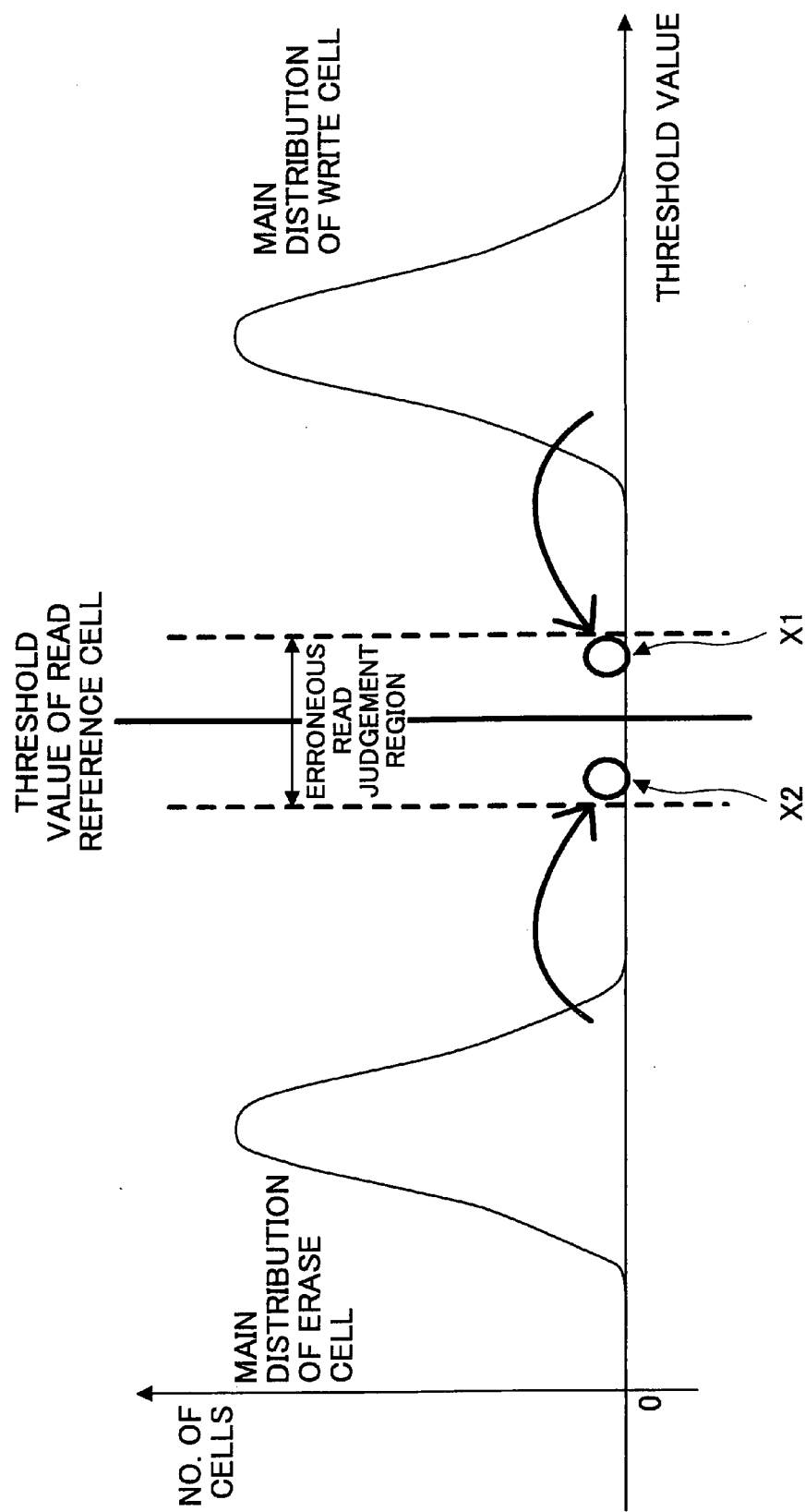
FIG. 2 is a diagram showing distributions of a written cell and an erased cell in the conventional nonvolatile semiconductor memory device.
Figure 3:
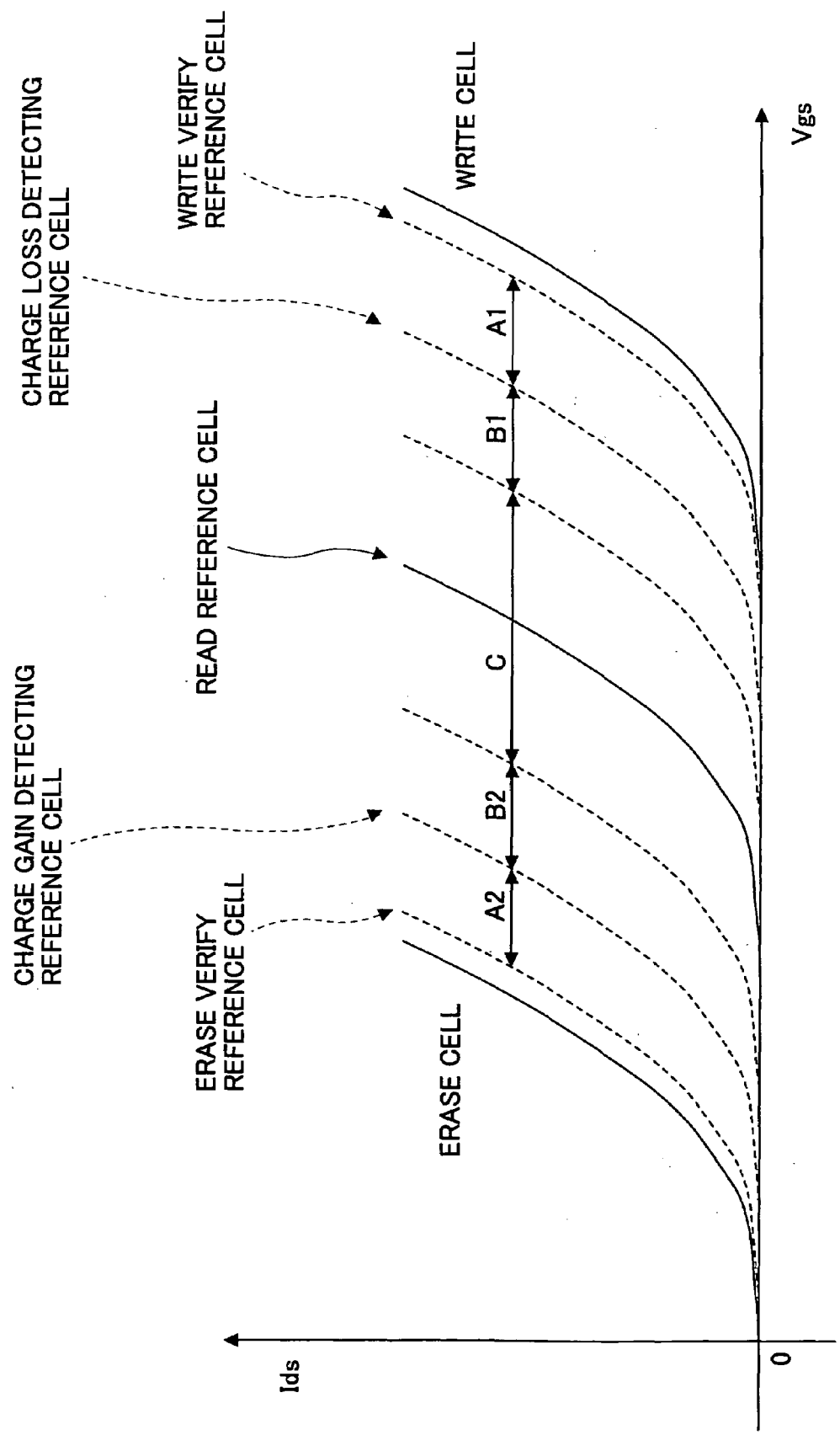
FIG. 3 is a diagram showing a relationship of threshold values of reference cells in a nonvolatile semiconductor memory device.

FIG. 3 is a diagram showing a relationship of threshold values of reference cells in a nonvolatile semiconductor memory device. In FIG. 3, the ordinate indicates a grain-source current (Ids) of a transistor forming each memory cell in arbitrary units, and the abscissa indicates a gate-source voltage (Vgs) of the transistor forming each memory in arbitrary units. The charge loss detecting reference cell is used to detect the tendency (or indication) of the charge loss, by setting a threshold value of the charge loss detecting reference cell to a value between a threshold value of the read reference cell and a threshold value of the write reference cell and so that a read judgement can be made in a normal manner.

The threshold value of the charge loss detecting reference cell is set to a position such that a deviation from the threshold value distribution of a normal write memory cell towards a lower threshold value side is detectable and a normal read is possible within ranges of a guaranteed temperature and a guaranteed voltage that guarantee normal operation of the semiconductor memory device. On the other hand, the threshold value of the charge gain detecting reference cell is set to a position such that a deviation from the threshold value distribution of a normal erase memory cell towards a higher threshold value side is detectable and a normal read is possible within ranges of the guaranteed temperature and the guaranteed voltage that guarantee normal operation of the semiconductor memory device.

Figure 4:
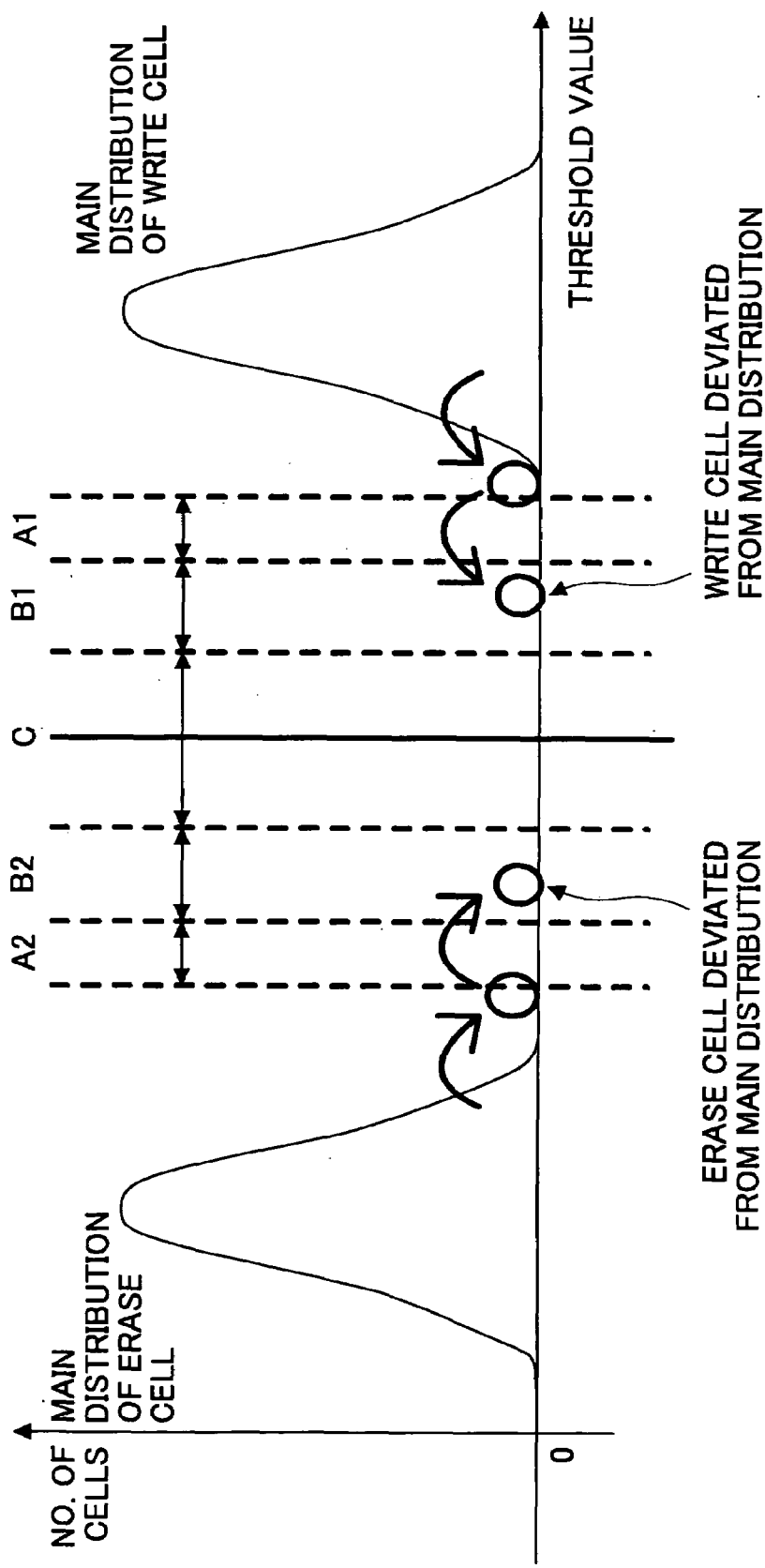
FIG. 4 is a diagram showing threshold values of 5 kinds of reference cells in an overlapping manner to threshold value distributions of memory cells.

In FIG. 3 and FIG. 4 which will be described later, A1 and A2 indicate safe read judgement regions in which the read data from the memory cell can be judged correctly, B1 and B2 indicate dangerous read judgement regions in which the read data from the memory cell can be judged correctly in the present state but there is a possibility of being judged erroneously in the future, and C indicates an erroneous read judgement region in which the read data from the memory cell is judged erroneously.

FIG. 4 is a diagram showing threshold values of 5 kinds of reference cells shown in FIG. 3 in an overlapping manner to threshold value distributions of the memory cells. In FIG. 4, the ordinate indicates a number of memory cells in arbitrary unit, and the abscissa indicates the threshold value in arbitrary units. In the memory cell which exhibits a characteristic abnormality, the threshold values gradually change towards the erroneous read judgement region by moving outside the main distributions of the written cell and the erased cell. Hence, if the abnormal memory cell can be detected and subjected to the redundancy substitution before the threshold values enter the erroneous read judgement region, it becomes possible to prevent an erroneous read judgement.

Figure 5:
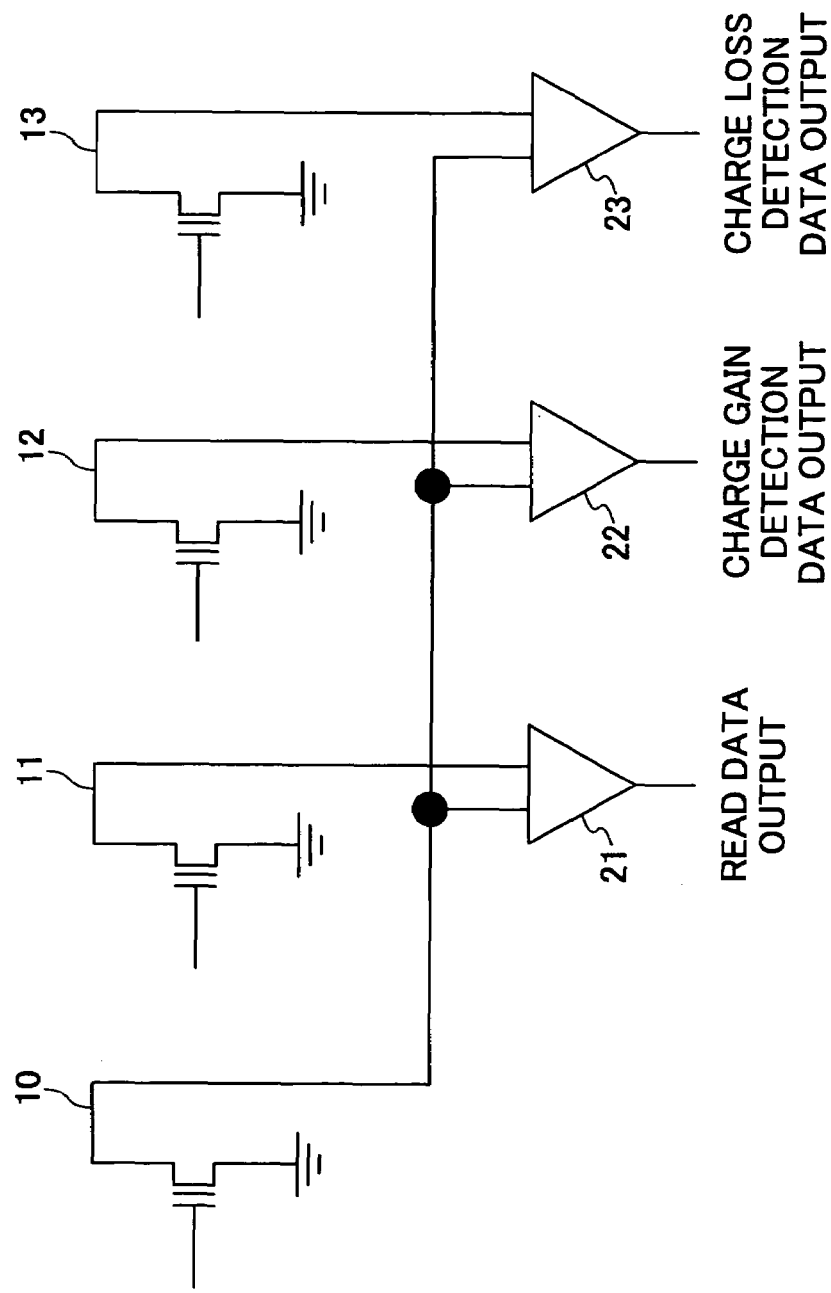
FIG. 5 is a circuit diagram showing an important part of a reference cell part and a sense amplifier part for explaining a method of detecting a charge loss and a charge gain in the nonvolatile semiconductor memory device.

FIG. 5 is a circuit diagram showing an important part of a reference cell part and a sense amplifier part for explaining a method of detecting the charge loss and the charge gain in the nonvolatile semiconductor memory device of this embodiment. The write verify reference cell and the erase verify reference cell within the reference cell part are used at the time of the write and the erase, and are not used at the time of the read. For this reason, the illustration of the write verify reference cell and the erase verify reference cell is omitted in FIG. 5, but the write verify reference cell and the erase verify reference cell are basically connected similarly to the read reference cell with respect to the memory cells. One input of a 2-input sense amplifier 21 for reading, one input of a 2-input sense amplifier 22 for charge gain detection, and one input of a 2-input sense amplifier 23 for charge loss detection are connected to a memory cell 10. The other input of the 2-input sense amplifier 21 is connected to a read reference cell 11 that is provided exclusively therefor. The other input of the 2-input sense amplifier 22 is connected to a charge gain detecting reference cell 12 that is provided exclusively therefor. The other input of the 2-input sense amplifier 23 is connected to a charge loss detecting reference cell 13 that is provided exclusively therefor. When making a read data judgement of the memory cell 10, it is possible to detect the charge loss and the charge gain simultaneously as the reading, without using extra time, by simultaneously operating a charge loss detection circuit and a charge gain detection circuit.

FIG. 6 is a diagram showing a relationship of outputs of the sense amplifiers for reading, charge loss detection and charge gain detection in the nonvolatile semiconductor memory device. In FIG. 6, a read data output is obtained from the sense amplifier 21 shown in FIG. 5, a charge loss detection data output is obtained from the sense amplifier 23 shown in FIG. 5, and a charge gain detection data output is obtained from the sense amplifier 22 shown in FIG. 5. If a case where the threshold value of the memory cell 10 is higher than the threshold value of the reference cell is defined as data "0" and a case where the threshold value of the memory cell 10 is lower than the threshold value of the reference cell is defined as data "1", it is judged that there is a tendency (or indication) of the charge loss for the data output combination designated by a case No. 2, and that there is a tendency (or indication) of the charge gain for the data output combination designated by a case No. 5. Accordingly, in this embodiment, in cases other than the case Nos. 1 and 4 shown in FIG. 6, the memory cell that has not been subjected to the redundancy substitution before the nonvolatile semiconductor memory device is forwarded is subjected to the redundancy substitution and substituted by a redundant memory cell. Hence, even in a state after the nonvolatile semiconductor memory device is forwarded and assembled into a system, it is possible to detect the tendency (or indication) of the charge loss and/or the charge gain and make the redundancy substitution before the erroneous read judgement occurs.

Next, a description will be given of the procedures for detecting the charge loss and/or the charge gain and making the redundancy substitution to substitute the memory cell that may cause the erroneous read judgement by the redundant memory cell.

Figure 7:
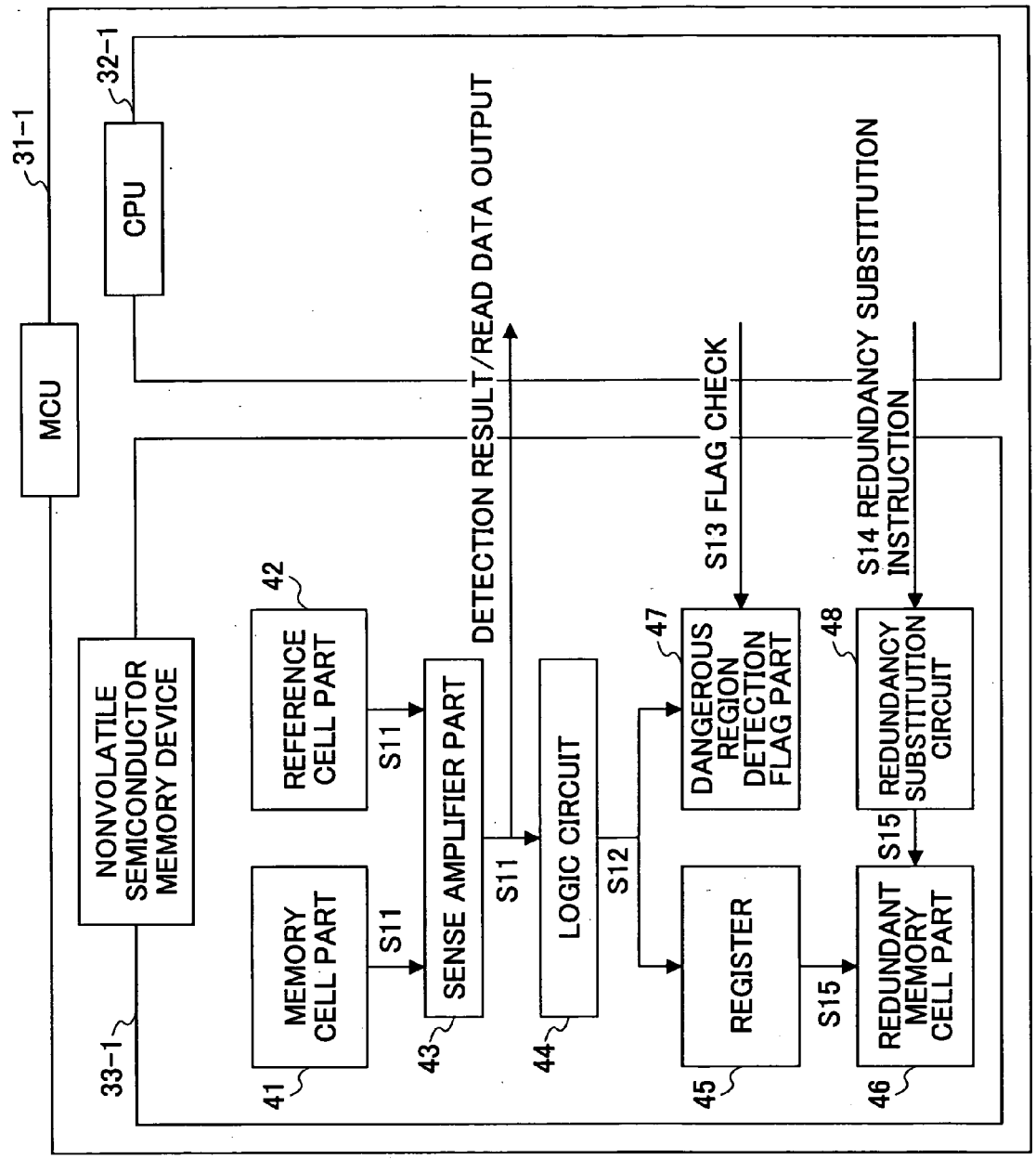
FIG. 7 is a system block diagram showing a first embodiment of a hardware structure of the semiconductor memory device according to the present invention.

FIG. 7 is a system block diagram showing a first embodiment of a hardware structure of the semiconductor memory device according to the present invention. For the sake of convenience, FIG. 7 shows a case where the nonvolatile semiconductor memory device forms a part of an information processing apparatus (MCU). Accordingly, this first embodiment of the semiconductor memory device forms a first embodiment of the information processing apparatus according to the present invention. In this embodiment, the charge loss and the charge gain in the semiconductor memory device are detected while a CPU executes a read instruction.

In FIG. 7, an information processing apparatus (MCU) 31-1 includes a CPU 32-1 and a nonvolatile semiconductor memory device 33-1 such as a flash memory. The nonvolatile semiconductor memory device 33-1 includes a memory cell part 41, a reference cell part 42, a sense amplifier part 43, a logic circuit 44 for detecting the dangerous read judgement region based on the relationship shown in FIG. 6, for example, a register 45 for storing a dangerous region address and data, a redundant memory cell part 46, a dangerous region detection flag part 47 which can also function as a notifying means for notifying the CPU 32-1 (outside the nonvolatile semiconductor memory device 33-1) when the charge loss and/or the charge gain are/is detected, and a redundancy substitution circuit 48. A physically integral memory cell array may be formed solely from the memory cell part 41 or, may include the reference cell part 42 and/or the redundant memory cell part 46 in addition to the memory cell part 41. However, it is desirable that the redundant memory cell part 46 is not included in the memory cell array. In addition, although the kind of memory cells forming the reference cell part 42 may be different from the kind of memory cells forming the memory cell part 41, it is undesirable for the characteristics of each of the memory cells to differ greatly. For this reason, it is desirable that the kind of memory cells forming the redundant memory cell part 46 is the same as the kind of memory cells forming the memory cell part 41.

The sense amplifier part 43 and the logic circuit 44 function as a detecting means for detecting the memory cell that has a tendency (or indication) of the charge loss and/or the charge gain based on the outputs of the memory cell part 41 and the reference cell part 42.

The dangerous region detection flag part 47 and the redundancy substitution circuit 48 function as a redundancy substitution means for subjecting the detected memory cell having the tendency (or indication) of the charge loss and/or the charge gain to the redundancy substitution.

The reference cell part 42 includes the read reference cell 11, the charge gain detecting reference cell 12 and the charge loss detecting reference cell 13 shown in FIG. 6, the write verify reference cell, and the erase verify reference cell. The sense amplifier part 43 includes the read sense amplifier 21, the charge gain detecting sense amplifier 22 and the charge loss detecting sense amplifier 23 shown in FIG. 6.

Each of the reference cells 11 through 13 may be provided with respect to a single memory cell 10 or, may be provided in common with respect to a plurality of memory cells 10.

In other words, one reference cell 11 may be provided with respect to a single memory cell 10 or, with respect to a plurality of memory cells 10, and the same applies to the reference cells 12 and 13. In the former case, it is difficult from the layout point of view to set the wiring lengths viewed from the reference cell to each of the sense amplifiers approximately the same with respect to each of the memory cells, thereby making it difficult to increase the read speed because the read speed is determined based on the longest wiring length. But according to the former case, it is possible to realize a semiconductor memory device having a stable characteristic because the read judgement and the like of each of the memory cells are made with reference to the threshold value of a single reference cell. On the other hand, in the latter case, it is possible to increase the read speed when compared to the former case because the wiring lengths viewed from the reference cell to each of the sense amplifiers can be averaged. However, according to the latter case, it is more difficult to realize a semiconductor memory device having a stable characteristic when compared to the former case, due to slight inconsistencies among the characteristics of the plurality of reference cells.

In a step S11, the sense amplifier part 43 within the nonvolatile semiconductor memory device 33-1 detects the charge loss and/or the charge gain, simultaneously as the reading, and outputs a charge loss detection result and/or a charge gain detection result to the CPU 32-1 together with the read data from the memory cell part 41. The charge loss detection result and/or the charge gain detection result are/is also output to the logic circuit 44.

In a step S12, when the tendency (or indication) of the charge loss and/or the charge gain (regions B1 and/or B2 in FIG. 6) are/is detected in the logic circuit 44, a charge loss dangerous region detection flag CLF and/or a charge gain dangerous region detection flag CGF are set (or turned ON) within the dangerous region detection flag part 47, and the address and data of the memory cell with respect to which the charge loss dangerous region detection flag CLF and/or the charge gain dangerous region detection flag CGF is set are stored in the register 45.

In a step S13, the CPU 32-1 checks the charge loss dangerous region detection flag CLF and/or the charge gain dangerous region detection flag CGF within the dangerous region detection flag part 47 of the nonvolatile semiconductor memory device 33-1, at an arbitrary timing that is determined by the CPU 32-1.

In a step S14, the CPU 32-1 issues a redundancy substitution instruction with respect to the redundancy substitution circuit 48 within the nonvolatile semiconductor memory device 33-1 if the charge loss dangerous region detection flag CLF and/or the charge gain dangerous region detection flag CGF is set.

In a step S15, the redundancy substitution circuit 48 within the nonvolatile semiconductor memory device 33-1 writes the address and data of the memory cell exhibiting the tendency (or indication) of the charge loss and/or the charge gain, that are stored in the register 45, to the redundant memory cell part 46.

Accordingly, even in the state where the MCU 31-1 is assembled within the system, the redundancy substitution of the memory cell that exhibits the tendency (or indication) of the charge loss and/or the charge gain can be made at a convenient timing determined by the CPU 32-1.

Figure 8:
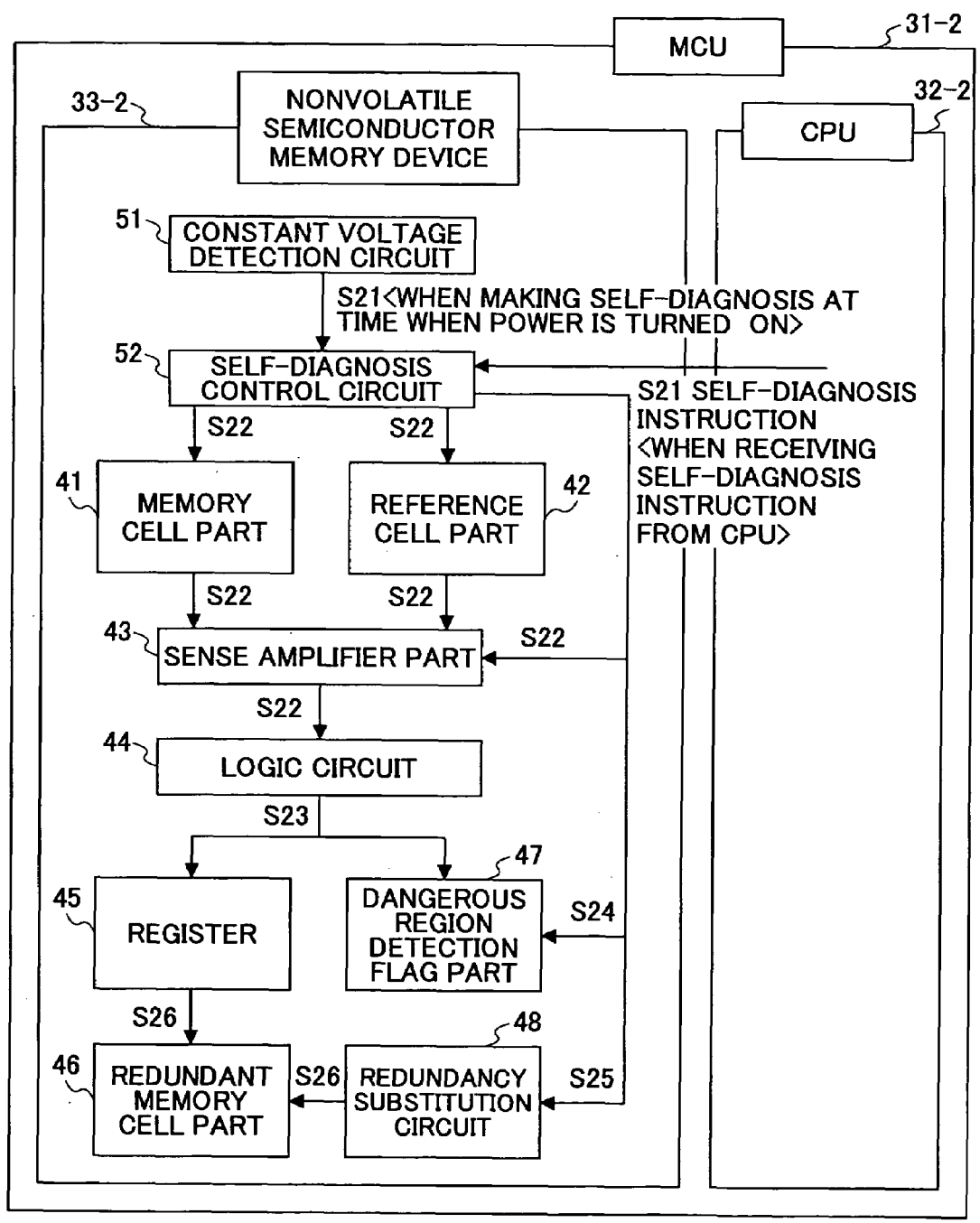
FIG. 8 is a system block diagram showing a second embodiment of the hardware structure of the semiconductor memory device according to the present invention.

FIG. 8 is a system block diagram showing a second embodiment of the hardware structure of the semiconductor memory device according to the present invention. In FIG. 8 those parts that are the same as those corresponding parts in FIG. 7 are designated by the same reference numerals, and a description thereof will be omitted. This second embodiment of the semiconductor memory device forms a second embodiment of the information processing apparatus according to the present invention. In this embodiment, the charge loss and the charge gain in the semiconductor memory device are detected when a self-diagnosis instruction is received from the CPU or, an automatic self-diagnosis is made when turning ON the power of a nonvolatile semiconductor memory device 33-2 (MCU 31-2) or when resetting the nonvolatile semiconductor memory device 33-2.

In FIG. 8, an information processing apparatus (MCU) 31-2 includes a CPU 32-2 and a nonvolatile semiconductor memory device 33-2. The nonvolatile semiconductor memory device 33-2 includes a constant voltage detection circuit 51, a self-diagnosis control circuit 52 that controls the self-diagnosis of the charge loss and/or the charge gain of the memory cell in response to a self-diagnosis instruction, a memory cell part 41, a reference cell part 42, a sense amplifier part 43, a logic circuit 44, a register 45, a redundant memory cell part 46, a dangerous region detection flag part 47, and a redundancy substitution circuit 48.

In a step S21, the constant voltage, detection circuit 51 within the nonvolatile semiconductor memory device 33-2 detects that the power supply voltage has reached a prescribed value when the power of the nonvolatile semiconductor memory device 33-2 (MCU 31-2) is turned ON or when resetting the nonvolatile semiconductor memory device 33-2 or, the self-diagnosis control circuit 52 within the nonvolatile semiconductor memory device 33-2 detects the self-diagnosis instruction that is issued by the CPU 32-2.

In a step S22, when the tendency (or indication) of the charge loss and/or the charge gain (regions B1 and/or B2 in FIG. 6) are/is detected in the logic circuit 44, a charge loss dangerous region detection flag CLF and/or a charge gain dangerous region detection flag CGF are set (or turned ON) within the dangerous region detection flag part 47, and the address and data of the memory cell with respect to which the charge loss dangerous region detection flag CLF and/or the charge gain dangerous region detection flag CGF is set are stored in the register 45.

In a step S24, after the checking of all of the memory cells within the memory cell part 41 ends, the self-diagnosis control circuit 52 checks the charge loss dangerous region detection flag CLF and/or the charge gain dangerous region detection flag CGF within the dangerous region detection flag part 47 of the nonvolatile semiconductor memory device 33-2.

In a step S25, the self-diagnosis control circuit 52 issues a redundancy substitution instruction with respect to the redundancy substitution circuit 48 within the nonvolatile semiconductor memory device 33-2 if the charge loss dangerous region detection flag CLF and/or the charge gain dangerous region detection flag CGF is set.

In a step S26, the redundancy substitution circuit 48 within the nonvolatile semiconductor memory device 33-2 writes the address and data of the memory cell exhibiting the tendency (or indication) of the charge loss and/or the charge gain, that are stored in the register 45, to the redundant memory cell part 46.

Accordingly, even in the state where the MCU 31-1 is assembled within the system, the redundancy substitution of the memory cell that exhibits the tendency (or indication) of the charge loss and/or the charge gain can be made at a timing when the automatic self-diagnosis is made when the power of the nonvolatile semiconductor memory device 33-2 (MCU 31-2) is turned ON or the nonvolatile semiconductor memory device 33-2 is reset or, at a timing when the nonvolatile semiconductor memory device 33-2 receives the self-diagnosis instruction from the CPU 32-2.

In the embodiments described above, both the charge loss detecting reference cell and the charge gain detecting reference cell are provided in the nonvolatile semiconductor memory device. However, the nonvolatile semiconductor memory device may of course be provided with only one of the charge loss detecting reference cell and the charge gain detecting reference cell. In other words, it is sufficient to provide the charge loss detecting reference cell in the case of the semiconductor memory device in which the charge loss is particularly a problem, and to provide the charge gain detecting reference cell in the case of the semiconductor memory device in which the charge gain is particularly a problem.

Moreover, in the embodiments described above, the nonvolatile semiconductor memory device is a part of the information processing apparatus (MCU) which has a CPU, but the present invention is not limited to such a structure. In other words, the nonvolatile semiconductor memory device may be separate from the CPU or, provided integrally with the CPU. In the case where the nonvolatile semiconductor memory device and the CPU are separate, the nonvolatile semiconductor memory device itself may form a single unit such as a module, package and chip or, the nonvolatile semiconductor memory device may be connected to a CPU by wires to form a single unit such as a module, package and chip. On the other hand, in the case where the nonvolatile semiconductor memory device is provided integrally with the CPU, the nonvolatile semiconductor memory device may be integrated so that the nonvolatile semiconductor memory device and a CPU coexist within a single unit such as a module, package and chip.

This application claims the benefit of a Japanese Patent Application No. 2005-259781 filed Sep. 7, 2005, in the Japanese Patent Office, the disclosure of which is hereby incorporated by reference.

Further, the present invention is not limited to these embodiments, but various variations and modifications may be made without departing from the scope of the present invention.

What is claimed is:

1. A redundancy substitution method for memory cells within an electrically writable and erasable semiconductor memory device, comprising the steps of:
    detecting a memory cell having a tendency of a charge loss and/or a charge gain, by use of a charge loss detecting reference cell and/or a charge gain detecting reference cell, said charge loss detecting reference cell having a threshold value set between a threshold value of a read reference cell and a threshold value of a write verify reference cell that is higher than that of the read reference cell, said charge gain detecting reference cell having a threshold value set between the threshold value of the read reference cell and a threshold value of an erase verify reference cell that is lower than that of the read reference cell; and
    subjecting to a redundancy substitution a memory cell whose tendency of the charge loss and/or the charge gain is detected.

2. The redundancy substitution method as claimed in claim 1, wherein the threshold value of the charge loss detecting reference cell is set to a position such that a deviation from a threshold value distribution of a normal write memory cell towards a lower threshold value side is detectable and a normal read is possible within ranges of a guaranteed temperature and a guaranteed voltage that guarantee normal operation of the semiconductor memory device.

3. The redundancy substitution method as claimed in claim 1, wherein the threshold value of the charge gain detecting reference cell is set to a position such that a deviation from a threshold value distribution of a normal erase memory cell towards a higher threshold value side is detectable and a normal read is possible within ranges of a guaranteed temperature and a guaranteed voltage that guarantee normal operation of the semiconductor memory device.

4. The redundancy substitution method as claimed in claim 1, wherein the charge loss and/or the charge gain are/is detected simultaneously as the reading from the memory cell.

5. The redundancy substitution method as claimed in claim 4, further comprising the steps of:
    setting a flag when the charge loss and/or the charge gain of the memory cell are/is detected, and storing address and data of the memory cell with respect to which the charge loss and/or the charge gain are/is detected,
    wherein said subjecting step substitutes the memory cell whose address and data are stored by the redundant memory cell in response to a redundancy substitution instruction issued from an external apparatus that checks the flag.

6. The redundancy substitution method as claimed in claim 1, wherein said detecting step detects the charge loss and/or the charge gain of the memory cell by reading from all of the memory cells in response to an external self-diagnosis instruction from outside the semiconductor memory device.

7. The redundancy substitution method as claimed in claim 1, wherein said detecting step detects the charge loss and/or the charge gain of the memory cell by reading from all of the memory cells when a power of the semiconductor memory device is turned ON or when the semiconductor memory device is reset.

8. The redundancy substitution method as claimed in claim 6 or 7, further comprising the steps of:
    setting a flag when the charge loss and/or the charge gain of the memory cell are/is detected, and storing address and data of the memory cell with respect to which the charge loss and/or the charge gain are/is detected,
    wherein said subjecting step substitutes the memory cell whose address and data are stored by the redundant memory cell when the flag is set after the reading from all of the memory cells ends.

9. An electrically writable and erasable semiconductor memory device comprising:
    a plurality of memory cells;
    a plurality of redundant memory cells;
    a read reference cell;
    a charge loss detecting reference cell having a threshold value set between a threshold value of the read reference cell and a threshold value of a write verify reference cell that is higher than that of the read reference cell;
    a charge gain detecting reference cell having a threshold value set between the threshold value of the read reference cell and a threshold value of an erase verify reference cell that is lower than that of the read reference cell;
    a detecting part configured to detect a memory cell having a tendency of a charge loss and/or a charge gain, based on an output of the charge loss detecting reference cell and/or an output of the charge gain detecting reference cell; and a redundancy substitution part configured to substitute a memory cell with respect to which the charge loss and/or the charge gain are/is detected by one of the redundant memory cells.

10. The semiconductor memory device as claimed in claim 9, wherein the threshold value of the charge loss detecting reference cell is set to a position such that a deviation from a threshold value distribution of a normal write memory cell towards a lower threshold value side is detectable and a normal read is possible within ranges of a guaranteed temperature and a guaranteed voltage that guarantee normal operation of the semiconductor memory device.

11. The semiconductor memory device as claimed in claim 9, wherein the threshold value of the charge gain detecting reference cell is set to a position such that a deviation from a threshold value distribution of a normal erase memory cell towards a higher threshold value side is detectable and a normal read is possible within ranges of a guaranteed temperature and a guaranteed voltage that guarantee normal operation of the semiconductor memory device.

12. The semiconductor memory device as claimed in claim 1, wherein the detecting part detects the charge loss and/or the charge gain are/is simultaneously as the reading from the memory cell.

13. The semiconductor memory device as claimed in claim 12, wherein the redundancy substitution part sets a flag when the charge loss and/or the charge gain of the memory cell are/is detected, and the semiconductor memory device further comprises:

a register configured to store address and data of the memory cell with respect to which the charge loss and/or the charge gain are/is detected.

14. The semiconductor memory device as claimed in claim 9, wherein said detecting part detects the charge loss and/or the charge gain of the memory cell by reading from all of the memory cells in response to an external self-diagnosis instruction from outside the semiconductor memory device.

15. The semiconductor memory device as claimed in claim 9, wherein said detecting part detects the charge loss and/or the charge gain of the memory cell by reading from all of the memory cells when a power of the semiconductor memory device is turned ON or when the semiconductor memory device is reset.

16. The semiconductor memory device as claimed in claim 14 or 15, wherein the detecting part sets a flag when the charge loss and/or the charge gain of the memory cell are/is detected, and further comprising:

a register configured to store address and data of the memory cell with respect to which the charge loss and/or the charge gain are/is detected, wherein the redundancy substitution part substitutes the memory cell whose address and data are stored in the register by the redundant memory cell when the flag is set after the reading from all of the memory cells ends.

17. An information processing apparatus comprising:
a CPU; and
an electrically writable and erasable semiconductor memory device,
said semiconductor memory device comprising:
a plurality of memory cells;
a plurality of redundant memory cells;
a read reference cell;
a charge loss detecting reference cell having a threshold value set between a threshold value of the read reference cell and a threshold value of a write verify reference cell that is higher than that of the read reference cell;
a charge gain detecting reference cell having a threshold value set between the threshold value of the read reference cell and a threshold value of an erase verify reference cell that is lower than that of the read reference cell;
a detecting part configured to detect a memory cell having a tendency of a charge loss and/or a charge gain, based on an output of the charge loss detecting reference cell and/or an output of the charge gain detecting reference cell; and
a redundancy substitution part configured to substitute a memory cell with respect to which the charge loss and/or the charge gain are/is detected by one of the redundant memory cells.

18. The information processing apparatus as claimed in claim 17, wherein:

the semiconductor memory device further comprises a register configured to store address and data of the memory cell with respect to which the charge loss and/or the charge gain are/is detected; and the redundancy substitution part substitutes the memory cell whose address and data are stored in the register by the redundant memory cell in response to a redundancy substitution instruction issued from an external apparatus that checks the flag.

19. The information processing apparatus as claimed in claim 17, wherein:

the semiconductor memory device further comprises a register configured to store address and data of the memory cell with respect to which the charge loss and/or the charge gain are/is detected; and the detecting part detects the charge loss and/or the charge gain of the memory cell by reading from all of the memory cells in response to an external self-diagnosis instruction from outside the semiconductor memory device.

20. The information processing apparatus as claimed in claim 17, wherein the CPU and the semiconductor memory device are integrally provided.

* * * * *